(12) United States Patent
Kim et al.

(10) Patent No.: US 6,885,700 B1
(45) Date of Patent: Apr. 26, 2005

(54) CHARGE-BASED FREQUENCY MEASUREMENT BIST

(75) Inventors: Seongwon Kim, Edmonds, WA (US); Mani Soma, Seattle, WA (US)

(73) Assignee: University of Washington, Seattle, WA (US)

( * ) Notice: Subject to any disclaimer, the term of this patent is extended or adjusted under 35 U.S.C. 154(b) by 708 days.

(21) Appl. No.: 09/669,487

(22) Filed: Sep. 25, 2000

Related U.S. Application Data

(60) Provisional application No. 60/155,634, filed on Sep. 23, 1999.

(51) Int. Cl.[7] .......................... H04B 17/00; H04B 3/46; H04Q 1/20
(52) U.S. Cl. .................................. 375/224; 455/180.3
(58) Field of Search ........................ 324/765; 371/22.1; 438/14; 365/201; 375/224

(56) References Cited

U.S. PATENT DOCUMENTS

| | | | |
|---|---|---|---|
| 4,672,610 A | * 6/1987 | Salick | 714/742 |
| 5,132,685 A | 7/1992 | DeWitt et al. | 341/120 |
| 5,202,626 A | 4/1993 | Pham et al. | 324/158 R |
| 5,793,822 A | * 8/1998 | Anderson et al. | 375/371 |
| 5,912,901 A | 6/1999 | Adams et al. | 371/22.5 |
| 6,005,407 A | * 12/1999 | Arabi et al. | 324/765 |
| 6,396,889 B1 | * 5/2002 | Sunter et al. | 375/376 |

OTHER PUBLICATIONS

Goteti, Devarayanadurg, Soma "DFT for Embedded Charge Pump PLL Systems Incorporating", IEEE 1149.1, p. 10.3.2.*

Goteti et al. (1997), "DFT for Embedded Charge–Pump PLL Systems Incorporating IEEE 1149.1," *IEEE Custom Integrated Circuits Conf.*, pp. 210–213.

Huang et al. (1999), "Specification back–Propagation and Its Application to DC Fault Simulation for Analog/mixed–Signal Circuits," *IEEE VLSI Test Symposium*, pp. 220–225.

Mixed Signal BIST [online]. LogicVision [retrieved on Sep. 24, 2000]. Retrieved from the Internet: <URL: www.logicvision.com/solution/tb_msbist.htm>.

p11BIST™—The Chip–Level Solution [online]. Logic Vision [retrieved on Sep. 21, 2000]. Retrieved from the Internet: <URL:www.logicvision.com/solution/p11bist.htm>.

Rayane et al. (1999), "A Digital BIST for Operational Amplifiers Embedded in Mixed–Signal Circuits," *IEEE VLSI Test Symposium*, pp. 304–310.

Sachdev, M. (1995), "A realistic defect oriented testability methodology for analog circuits," *J. of Electron. Testing: Theory and Appl.*, vol. 6 pp. 265–276.

Soma, M. (Jan. 1996), "Challenges in Analog and Mixed–Signal Fault Models," *Circuit & Devices*, pp. 16–19.

Toner, M.F. and Roberts, G.W. (1993), "A BIST Scheme for an SNR Test of a Sigma–Delta ADC," *IEEE Proceed. Intern. Test Conf.*, pp. 805–814.

(Continued)

*Primary Examiner*—Stephen Chin
*Assistant Examiner*—Harry Vartanian
(74) *Attorney, Agent, or Firm*—Greenlee, Winner and Sullivan, P.C.

(57) ABSTRACT

A charge-based frequency measurement BIST (CF-BIST) for clock circuits and oscillator circuits is described that requires no outside test stimulus and produces a digital test output. The CF-BIST technique performs structural and defect-oriented testing and uses existing blocks to save die area. The technique adds a multiplexer to the non-sensitive digital path. The system uses the existing VCO as the measuring device and divide-by-N as a frequency counter to reduce the area overhead. The described technique produces an efficient pass/fail evaluation, low-cost and practical implementation of on-chip BIST structure.

17 Claims, 6 Drawing Sheets

OTHER PUBLICATIONS

Veillette, B.R. and Roberts, G.W. (1997), "On–Chip Measurement of the Jitter Transfer Function of Charge–Pump Phase–Locked Loops," *IEEE Proceed. Intern. Test Conf.*, pp. 776–784.

Veillette, B.R. and Roberts, G.W. (1998), "Stimulus Generation for Built–In Self–Test of Charge–Pump Phase–Locked Loops," *IEEE Proceed. Intern. Test Conf.* pp. 698–707.

Xing, Y. (1998), "Defect–Oriented Testing of Mixed–Signal ICs: Some Industrial Experience," *IEEE Proceed. Intern. Test Conf.*, pp. 678–687.

Abramovici et al. (1990), "Digital Systems Testing and Testable Design," *Comp. Sci. Press*, pp. 395–407.

Arabi, K. and Daminska, B. (1997), "Oscillation Built–In Self Test (OBIST) Scheme for Functional and Structural Testing of Analog and Mixed–Signal Integrated Circuits," *IEEE Proceed. Intern. Test Conf.*, pp. 786–795.

Arabi, K. and Daminska, B. (1997), "Design and Realization of an Accurate Built–In Current Sensor On–Line Power Dissipation Measurement and $IDDQ$ Testing," *Proceed. Intern. Test Conf.*, pp. 578–586.

Azais et al. (Jun. 1999), "A Unified Digital Test Technique for PLLs: Catastrophic Faults Covered," *IEEE Intern. Mixed Signal Test. Workshop* [online] [retrieved on Mar. 14, 2001], Retrieved from the Internet: <URL:http://www.lirmm.fr/~azais/publis/IMSTW99.ps>.

Devarayanadurg et al. (1996), "Hierarchy Based Statistical Fault Simulation of Mixed–Signal ICs," *IEEE Proceed. Intern. Test Conf.*, pp. 521–527.

Gardner, F.M. (Nov. 1980), "Charge–pump phase–lock loops," *IEEE Trans. Commun.* vol. COM–28:1849–1858.

* cited by examiner $C = (t_1-t_0)f(V_A)$

CHARGE-BASED FREQUENCY MEASUREMENT BIST

CROSS-REFERENCE TO RELATED APPLICATIONS

This application takes priority to provisional application Ser. No. 60/155,634, filed Sep. 23, 1999, which is hereby incorporated by reference to the extent not inconsistent with the disclosure herein.

BACKGROUND OF THE INVENTION

Analog and mixed-signal testing is an important issue that affects both the time-to-market and product cost of many modem electronic systems. One key to the success of products with these properties is Built-In Self-Test (BIST) of circuits and systems. Although BIST for digital IC's is widely used [1], manufacturers of mixed-signal IC's are still searching for an appropriate BIST solution [3–8]. An important concern of IC manufacturers is the "overhead" required to implement BIST on their systems.

The phase-locked loop (PLL) is a mixed-signal block used in a large number of applications such as frequency synthesis, phase demodulation, clock distribution and timing recovery. It is thus essential for systems like wireless phones, optical fiber links and micro-computers. PLLs are even expected to appear soon on other purely digital circuits such as field-programmable gate arrays (FPGA) and digital signal processors (DSP). But the PLL is one of the most difficult system to apply a BIST scheme, due to its tight feedback [9].

Previous literatures in PLL BIST have focused on functional evaluation of the PLL under test. Testing using functional specifications verifies the functionality of the circuit at some pre-specified test points. On-chip measurement of the jitter transfer function technique emphasizes on-chip jitter generation and output jitter measurement [6], [13]. The technique described in [6], [13] suffers from area overhead, due to the fact that it needs a delta-sigma modulator to generate the jitter inside the chip. This technique also suffers from analog node loading problems. In [10] a method is presented to convert a closed loop circuit requiring frequency measurement into an open loop circuit in which dynamic delay is measured. Recent work re-configures the PLL in a new structure allowing a simple Boolean test to be applied [14]. These two techniques described in [10, 14] break the VCO oscillation loop which is the most sensitive analog path in the PLL. This has a significant alteration in the VCO linearity and range, as well as the overall PLL characteristics in high-frequency applications. A technique introduced in [12] reports to test the PLL by performing on-chip measurement of certain functional specifications and comparing them on-chip to ATE (Automated Test Equipment)-supplied digital limits using digital circuitry. ATE generally means external test systems. This technique has the disadvantages of requiring an ATE and also a PLL lock indicator inside the chip, which increases the overall test cost. For the signal injection method, the matching to the two charge-pumps is a cause of errors.

Functional testing can result in either excessive or insufficient testing of the circuit. Fault-based testing is an alternative to functional testing, which targets the presence of physical defects in a PLL, thus providing a quantitative measure of the test process [11].

Studies on a number of analog circuits show that relatively simple tests can give high test coverage for common defects, and this can be achieved by using the defect-oriented testing approach [16]. At the same time it also became clear that these tests are not able to cover all faulty products caused by process parametric variations. However, as the result of the ever increasing functional complexity of mixed-signal ICs and the improved IC fabrication-process control, spot defects are the dominant yield limiter in a mature process and a dominant cause of customer rejects for a product in high volume production [2].

Described here is a new BIST technique for clock and oscillator circuits based on defect-oriented testing, which uses existing analog components to reduce area overhead and for practical high-speed PLL applications. This scheme can incorporate IEEE 1149.1 boundary scan architecture for easy access of the BIST output, use the existing scan path if available, or use other scanning techniques known to the art. One advantage of this technique is that there is no change to the sensitive analog blocks. This ensures that the characteristics of the loop-filter, charge-pump, and VCO are not altered by using the described BIST scheme.

BRIEF SUMMARY OF THE INVENTION

Provided is a method of testing clock or oscillator circuits, including phase-locked loops. This method uses a component of the circuit to provide the test stimulus and uses components of the circuit to generate output values. These output signals are compared to base values that are determined by logic or behavioral simulations as known in the art. If the output values and base values are significantly different, the circuit is determined to have an error or fault. Circuits as used herein include integrated circuits.

Also provided is a method of self-testing a circuit for a fault comprising: applying an input stimulus to a self-test component of said circuit; detecting an output value from said circuit; and comparing the output value to a base value, wherein a significant difference indicates a fault is present. A component of the circuit indicates the component is provided as an existing block in the circuit. This saves die area. However, any component may be part of another circuit or system (for example, a counter in an external tester) as long as it is available during the exercise of the test. The circuit under test includes clock circuits and oscillator circuits. One embodiment of the comparing step comprises producing a fail signal when there is a significant difference between said output value and said selected base value, and producing a pass signal when there is no significant difference between said output value and said selected base value. The comparing step may also produce other signals which are compared with base values, as is known in the art. Preferably, the circuit is a phase-locked loop. Faults that can be detected include structural and parametric (including performance). The circuit preferably consists essentially of a loop filter, a multiplexer, a controller, a charge-pump, a voltage controlled oscillator (VCO), a divide-by-N component and a phase detector, but other components may be present. The input stimulus preferably comprises a signal applied to a controller, which controller communicates to the multiplexer, which multiplexer drives the charge pump, which charge pump drives the loop filter, which loop filter drives the voltage controlled oscillator to generate said output value.

Self-test components of the circuit include those useful in controlling and monitoring the test. In a particular embodiment, the self-test component is a controller/grabber.

Also provided is a circuit containing a built-in self test comprising: a test controller; a multiplexer connected to said test controller; a charge pump connected to said multiplexer;

a loop filter connected to said charge pump; a VCO connected to said loop filter; a divide-by-N connected to said VCO and to said test controller; a phase detector connected to said multiplexer and to said divide-by-N; a circuit input connected to said phase detector; and a circuit output connected to said divide-by-N. The circuit is preferably a phase locked loop which consists essentially of the components listed above.

Also provided is a method of testing a circuit which contains a built-in self test comprising: applying a start test signal to a test controller which generates a test stimulus; applying said test stimulus to a multiplexer which generates a charge signal; applying said charge signal to a charge pump which generates a filter signal; applying said filter signal to a loop filter which generates an output voltage; applying said output voltage to a VCO which generates an output frequency; transmitting said output frequency to said test controller; and comparing said output frequency to a base value. In the method, the output frequency may be converted to a digital value by a divide-by-N, as is known in the art. The method is preferably used to test a phase-locked loop.

Also provided is a method of testing a phase locked loop circuit which contains a built-in self test consisting essentially of the steps: applying a start test signal to a test controller which is a component of said circuit which controller generates a test stimulus; applying said test stimulus to a multiplexer which generates a charge signal; applying said charge signal to a charge pump which generates a filter signal; applying said filter signal to a loop filter which generates an output voltage; applying said output voltage to a VCO which generates an output frequency; transmitting said output frequency to said test controller; and comparing said output frequency to a base value.

Any of the components listed for the PLL or the circuit in question may be a part of another circuit or system (for example, a counter in an external tester) as long as it is available during the exercise of the test.

As used herein, a "test stimulus" or "input stimulus" is any signal useful in performing a test of the circuit. Test stimuli may include the test clock. Test stimuli may also include a signal to start the test, a signal for the UP test, a signal for the DOWN test, and a signal to end the test.

The methods and apparatuses described herein can be used in any application which has some kind of oscillating block and a counter. For example, any block capable of producing a voltage (or current) ramp signal can be used.

The test methods described herein can detect a fault in the circuit in many ways. In one embodiment, a value near a mid-point (described in more detail below) (reference voltage) is generated by using the charge pump as a voltage divider. This reference value is converted to frequency using the VCO and counted by the divide-by-N block. The loop filter can be discharged and the output voltage can be converted to frequency and counted as above (down measurement). The loop filter can also be charged and the output voltage converted to frequency in a similar manner (up measurement). The difference between the reference and the up measurement and the reference and the down measurement can be determined. These differences are compared to base values, where a significant difference indicates a fault. Also, if the difference between the up and down measurements is significantly different than a selected base value, a fault is indicated. Base values are determined by logic or behavioral simulations, as is well known in the art and performed without undue experimentation. The level of difference required for there to be a "significant difference" between the output value and the base value depends on the process and on a particular company's determination, depending on their expectations, the uses for the test results, and other factors. Each company or application may have a different level for a significant difference, and the invention described herein can accommodate any definition. As one of ordinary skill in the art will appreciate, other comparisons may be made without undue experimentation.

As used herein, a constant current is a current within about 1% of an average value.

Faults that can be detected using the methods and apparatuses described herein include structural and parametric faults. Structural faults are generally physical errors in the circuit or a component thereof. Structural faults include but are not limited to:
Gate-to-source short (GSS)
Gate-to-drain short (GDS)
Drain-to-source short (DSS)
Resistor-short (RS)
Capacitance-short (CS)
Gate-open (GO)
Drain-open (DO)
Source-open (SO)
Resistor-open (RO)

Parametric faults are generally those which affect the performance of the circuit. Parametric faults include but are not limited to jitter, lock range, loop gain and lock time. Data which is used to measure parametric faults is returned to the test controller or measured in the circuit. One example of testing for the parametric fault of jitter includes checking for mismatch between the up and down currents which is the output of the charge-pump circuit. The mismatch between up and down currents of the charge pump is a major cause for jitter at the output of the PLL.

As used herein, "circuit" may be analog or mixed analog-digital.

DETAILED DESCRIPTION OF THE INVENTION

Figure 1:
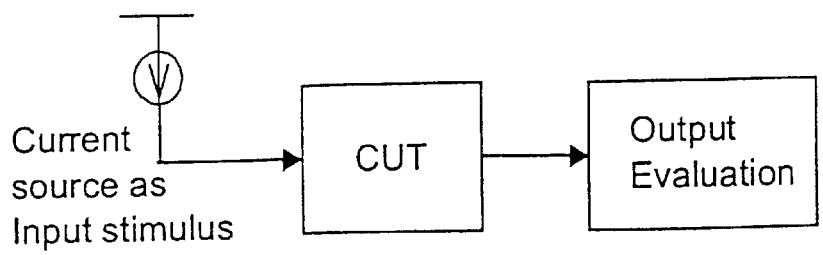
FIG. 1 illustrates the fundamental theory of the BIST technique.

The fundamental theory of the BIST technique for a PLL is shown in FIG. 1. A constant current source is injected to the CUT (Circuit Under Test) as an input stimulus. The resulting signature output is measured and evaluated by the output evaluation block. The CUT in this case consists of analog circuitry with a relatively low input impedance. The output of the CUT is usually a voltage value which is the multiply of the input current injected and the impedance of the CUT circuit. Thus, any change in the impedance will affect the signature output of the CUT, where CUT impedance can be altered by any type of faults including physical defects.

This testing scheme can be adapted to a PLL for testing the entire PLL, by designating the loop-filter of the PLL as the CUT block. Thus, the relationship between the constant current input I to the corresponding voltage output V can be written as in equation (1) for a simple RC loop-filter, where t denotes the duration of time the input current is applied.

$$V = RI + \frac{1}{C} \cdot \int_t I \, dt \quad (1)$$

Thus, a fault can be screened by comparing the magnitude of the output voltage V against a mask (base value).

Figure 2:
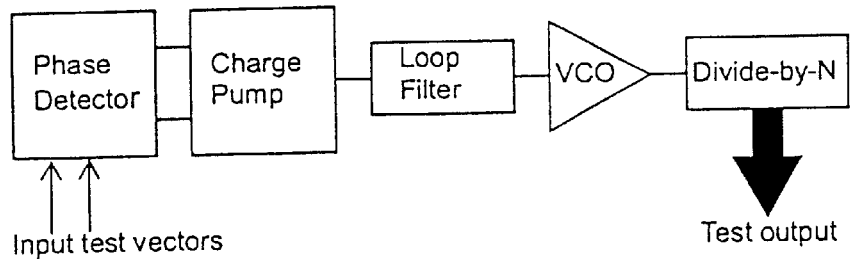
FIG. 2 illustrates a PLL with an open loop configuration.

For a more detailed description of this technique, a PLL with an open loop configuration as in FIG. 2 is described. For a constant current source used in this test, the existing charge-pump in the PLL is preferably utilized which generates a current source by digitally controlling the input of the charge-pump circuit. Other current sources may be used, but then the charge pump must also be tested. By using the existing charge-pump, there are three major advantages:

It eliminates the need for on-chip precision current source which will occupy a relatively large die area.

The charge-pump itself is tested for possible faults. This saves the overall test time by performing a single test for multiple blocks.

The sensitive loop-filter input node is not altered since the current source which is the output of the charge-pump is already connected to the loop-filter. This ensures the sensitive analog node is not loaded which is a common problem in previous PLL BIST techniques [6],[10], [13].

The existing VCO and the divide-by-N block is used as an example for the output voltage measuring device to measure the output voltage signature of the loop-filter. Any counter may be used as the voltage measuring device. The VCO generates an output frequency according to the loop-filter's output voltage, the VCO output is then fed to the divide-by-N block which acts as a frequency counter. Thus, by retrieving the binary data store in the counter, the output frequency of the VCO which represents the output signature of the loop-filter is read digitally. Some advantages of using the existing VCO and divide-by-N as a measuring device are:

It eliminates the need for an on-chip precision voltage measuring device, which can take up considerable die area.

As the output voltage of the loop-filter is being measured, the VCO and divide-by-N blocks are also tested for possible faults.

The VCO is tested without any change to its sensitive analog feedback loop.

The test output is in a digital form, thus enabling the test controller and evaluation blocks to be constructed with only the digital parts.

This method can test all the analog blocks in a PLL for possible faults and can test for the location of the fault in the circuit. The location of faults in the circuit can be determined by variation in output values, as known to one of ordinary skill in the art. One major advantage of the technique described herein is that it uses mostly existing blocks for testing and measurement, thus minimizing the area overhead. Furthermore, the test output is transformed into a digital value which can be evaluated with relatively reliable digital circuitry.

Figure 3:
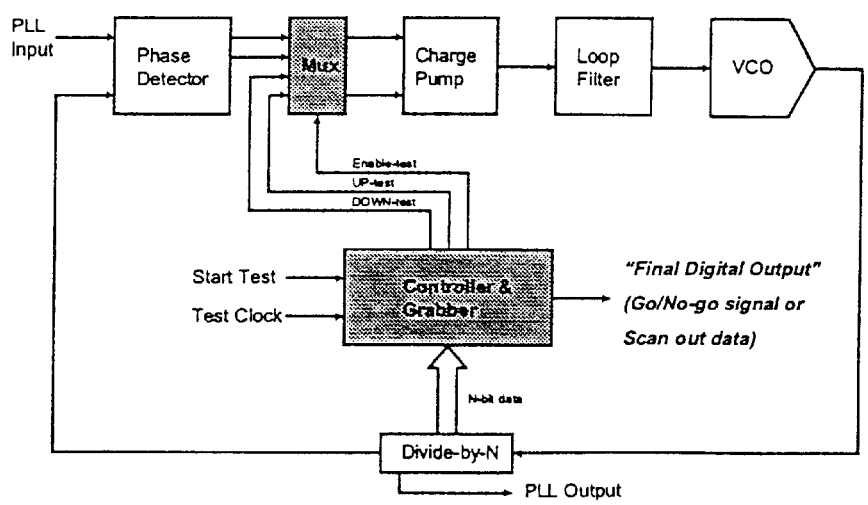
FIG. 3 illustrates one embodiment of the BIST technique for a PLL.

An example of one embodiment of the invention is the CF-BIST block diagram shown in FIG. 3, where a controller/grabber block and a multiplexer are added to the existing PLL. This example is described in further detail below.

Figure 4:
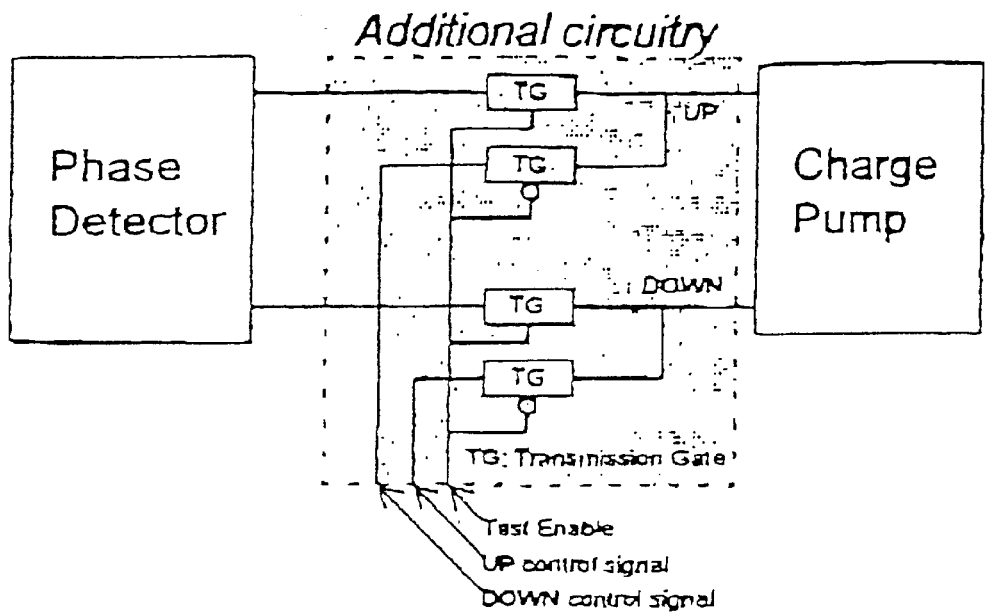
FIG. 4 illustrates one embodiment of the multiplexer.

The multiplexer (mux) is added to the output of existing phase-detector block and provides input controls for stimulating the loop-filter. One embodiment of the mux is shown in FIG. 4. In normal PLL operation, the mux is set to bypass the phase-detector output signals. In test mode, the mux provides charge-pump control signals generated by the controller/grabber block to the charge-pump input. The VCO then oscillates according to the output voltage of the loop-filter. The oscillation frequency reflects the faults in the loop-filter, charge-pump, and the VCO. The deviation of the oscillation frequency from its nominal value (base) indicates a faulty circuit in the loop. This test method does not require any analog test signals. Furthermore, the oscillation frequency is measured on-chip using the existing divide-by-N block which acts as a counter. Thus, the final output is a pure digital value which increases the precision of the test. Also, the described method does not alter any exiting analog circuitry, it only needs a slight modification in the digital part which can be added during the PLL design.

Controller/Grabber Block

When the BIST system is active, the controller/grabber block controls the multiplexer in the phase-detector to provide proper stimulus for the loop-filter. It consists of two sub-blocks which are the state-machine and the grabber, and the entire block consists of digital components, thus, it is highly reliable compared to analog counterparts.

Divide-by-N

The divide-by-N, which is used in a PLL to shift the output frequency to the input dynamic range, is utilized as a frequency counter in the described BIST system. When the BIST system is in the self-test mode, the divide-by-N counts the output frequency of the VCO and the resulting digital value is grabbed and stored by the controller/grabber block. The digital frequency data stored in the controller/grabber block can be scanned out using the IEEE 1149.1 boundary scan path or any scan path available.

Voltage Measurement Technique Without a Sample-and-Hold Function

In order to measure the output voltage of the loop-filter, normally a voltage sample-and-hold circuit is needed to hold the ramping voltage value at a certain time. Unfortunately, sample-and-hold circuits are expensive to include in a chip in terms of die area.

Figure 5:
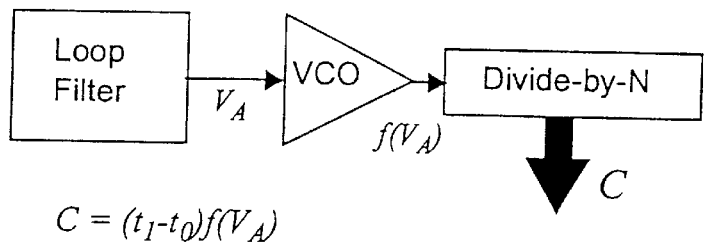
FIG. 5 illustrates the output voltage measurement using an average-count method.
Figure 5:
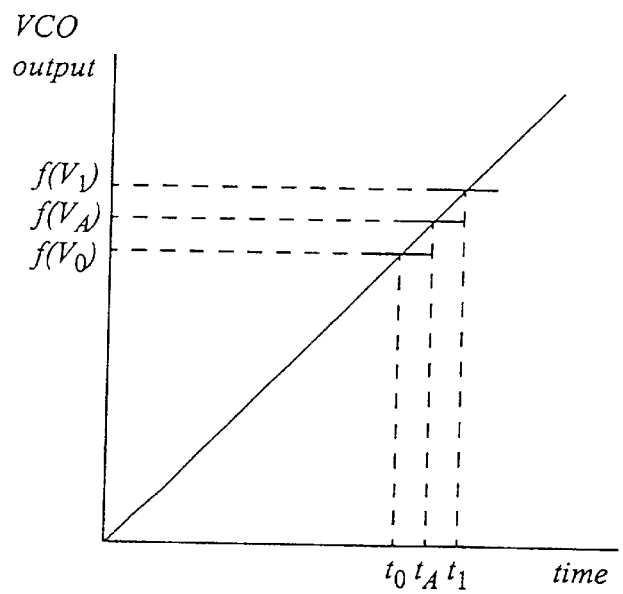

Described here is a simple average-count method. The simple average-count method used to obtain the voltage value does not need any additional circuit components, it performs a sample-and-hold function using the existing VCO and divide-by-N block. FIG. 5 is shown to better understand the method.

FIG. 5 shows the VCO output frequency transition during the test. $t_A$ is the time when the output voltage value should be sampled-and-held; $t_0$ is the time the divide-by-N which acts as a counter starts to count. Counting starts by simply enabling the counter's flip-flops which were cleared in the initial stage. $t_1$ represents the time when the counter halts counting and keeps its binary values. $f(V_0)$ and $f(V_1)$ are VCO output frequencies due to input voltages $V_0$ and $V_1$, respectively, which occurred at time $t_0$ and $t_1$, respectively.

The following assumptions are made to simplified the equations presented:

$$t_A - t_0 = t_1 - t_A \quad (2)$$

$$f(V_A) - f(V_0) = f(V_1) - f(V_A) \quad (3)$$

The counter output value C can be written as:

$$C = T \cdot F \quad (4)$$

where T is the time period when the counter is active, and F is the frequency of the input during T. By using the relations shown in equations (2) and (3), we can write $$T = t_1 - t_0$$

$$F = \frac{f(V_1) + f(V_0)}{2} = f(V_A)$$

Therefore, from equation (4), $$f(V_A) = \frac{C}{t_1 - t_0} \quad (5)$$

Equation (5) implies that if the counter counts $t_0$ to $t_1$, it will have the average frequency value $f(V_A)$ during the count. Therefore, the voltage value $V_A$, which was the target voltage to sample-and-hold, is measured and stored in the counter after T period.

The above explanation shows that the method described herein does not need a sample-and-hold block to obtain a voltage value $V_A$ from the loop-filter output. Instead, it only needs a proper enable signal for the counter which is the divide-by-N block. This enable signal is easily generated by the state-machine in the controller/grabber block.

Test Clock Speed, Counter Bit Number Determination Algorithm

To determine the test clock frequency and the bit-width of the counter, three input specifications are needed for calculation:

$F_{max}$ Maximum VCO output frequency
$F_{min}$ Minimum VCO output frequency
A Accuracy of the measurement in (%).

From $F_{max}$ and the test duration T, the maximum counter output $C_{max}$ is given by $$C_{max} = \frac{T}{1/(F_{max})} \quad (6)$$

where T is the amount of time the counter is enabled for a measurement. If the resolution of the measurement A in equation (6) is included, it gives the following relationship:

$$C_{max} - 1 = \frac{T}{\frac{1}{F_{max} - (F_{max} - F_{min}) \cdot A}} \quad (7)$$

where $(F_{max} - F_{min})A$ represents the minimum value of frequency that can be measured with the counter. Combining equation (6) and (7) gives $$C_{max} = \frac{F_{max}}{(F_{max} - F_{min}) \cdot A} \quad (8)$$

To count up to $C_{max}$, the counter must have at least $C_B$ bits, where:

$$C_B = \text{Integer}(\log_2 C_{max}) + 1$$

The test duration T can be calculated using the following equation:

$$T = \frac{C_{max}}{F_{max}}$$

Therefore, the test clock frequency F test is given below.

$$F_{test} = \frac{1}{T}$$

For example, if a PLL has following specifications:
$F_{max}$=900 MHz
$F_{min}$=400 MHz
A=0.01 (1% resolution in measurement),
then from equation (8), $C_{max}$ is 180 which yields the counter bit-width of 8 bits. Further through the procedure yields $F_{test}$ to be 5 MHz which is the test clock speed. Hence, 8 bit wide counter and 5 MHz test clock are the only information needed to construct the CF-BIST structure in this example. If the bit with is not sufficient, the test can still be performed, but is not as accurate. If the clock frequency is not correct, the count values will be drastically different from the expected values. This is easily detectable. Adequate bit width for the desired function and for testing can be designed in the circuit.

CF-BIST Test Procedure

Figure 6:
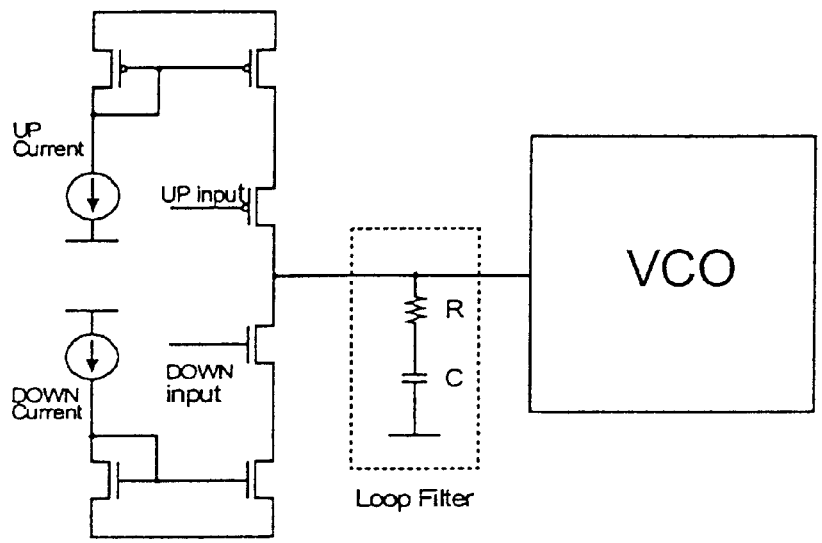
FIG. 6 is a simplified schematic of the charge pump and the loop filter.

In order to better understand the concept of CF-BIST technique, a simplified schematic diagram of the charge-pump and the loop-filter (FIG. 6) is used. The charge-pump injects a constant current for a certain period of time to the loop-filter, creating a output voltage variation in the loop-filter. This is then converted in to a frequency value by the VCO. Finally, the divide-by-N which acts as a counter converts the frequency value into a digital data for a simple test output evaluation. The detailed test procedure is as follows:

STEP 1: DC Reference Count

1. DC voltage generation: A DC voltage is generated by closing both the up and down current transistors to form a voltage divider. The generated DC voltage should be around mid-point voltage. Since this mid-point value is used as a reference value instead of an absolute value, it is not necessary to be at the exact mid-range.

2. Voltage measurement: The generated DC voltage is converted to frequency by the VCO and counted by the divide-by-N block. The DC voltage value which is now in a digital form, is grabbed and stored in the controller/grabber block which is the reference-count (F1) in FIG. 7.

STEP 2: Discharge Test

3. Stimulus injection: In order to discharge the loop-filter, the up-current switch is opened while the down-current switch is kept closed. This down-current acts as the input stimulus for the loop-filter test.

4. Voltage measurement: At the end of the discharge period, the output voltage of the loop-filter is measured with the VCO and the counter. This value is stored in the controller/ grabber block as down-count (F2) which can be scanned out using the scan path at the final test step.
STEP 3: Charge Test
5. Stimulus injection: In order to charge the loop-filter, the down-current switch is opened while the up-current switch is kept closed. This up-current acts as the input stimulus for the loop-filter test.
6. Voltage measurement: At the end of the charge period, the output voltage of the loop-filter is measured with the VCO and the counter, and this digital value is grabbed and stored in the controller/grabber block as up-count (F3) which will be used in the next step.

Figure 7:
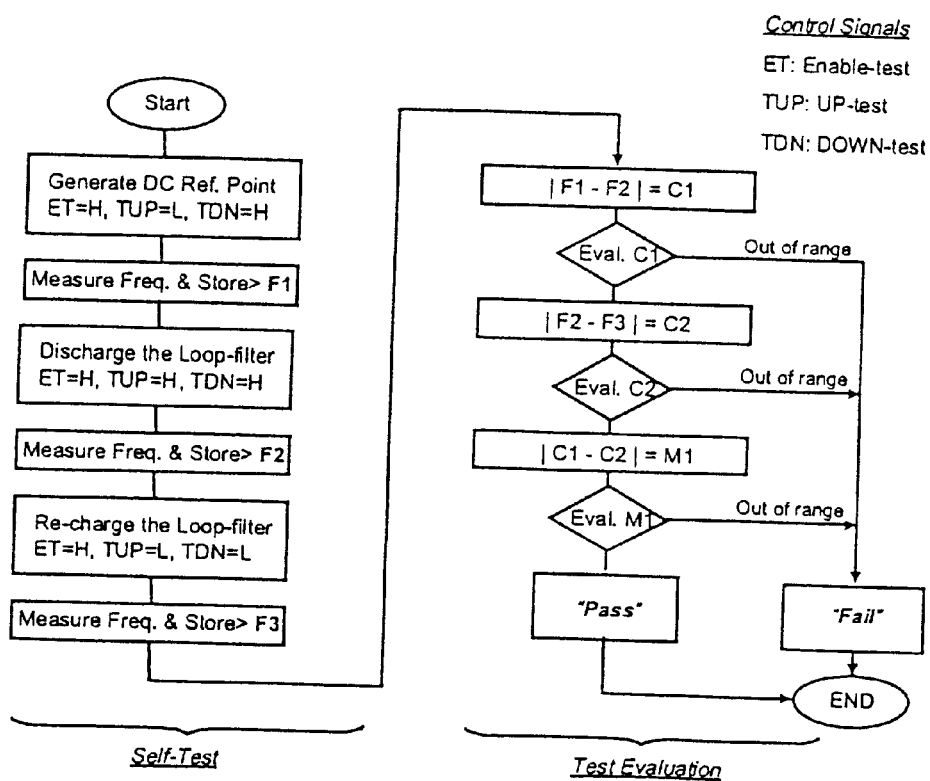
FIG. 7 is a flow chart of one embodiment of the overall self-test procedure.
Figure 8:
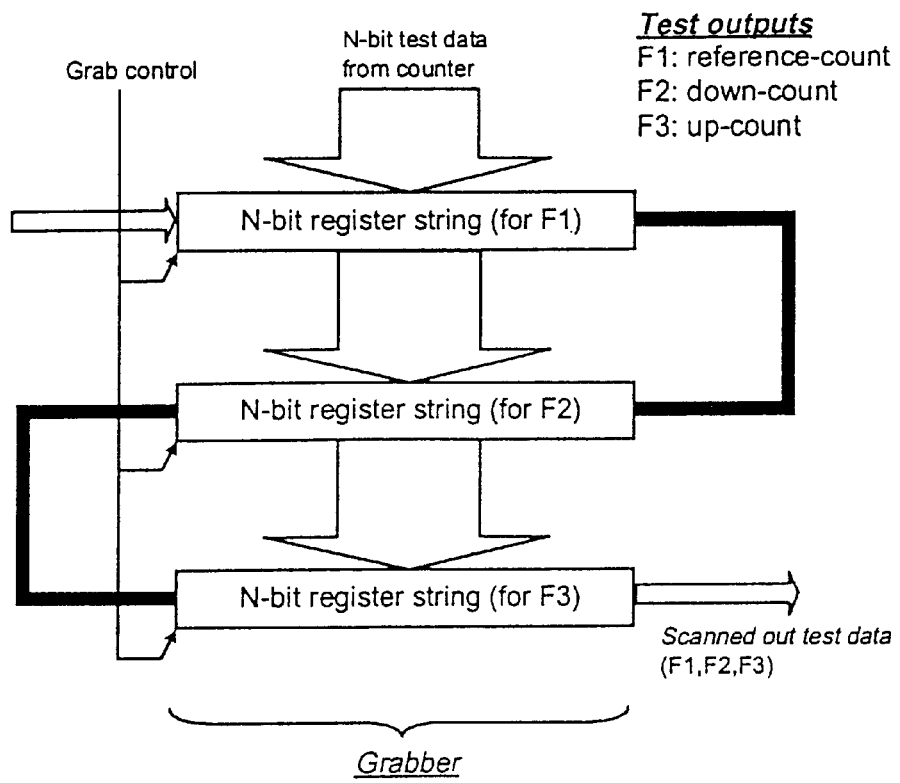
FIG. 8 illustrates the grabber portion of the controller/grabber block.
Figure 9:
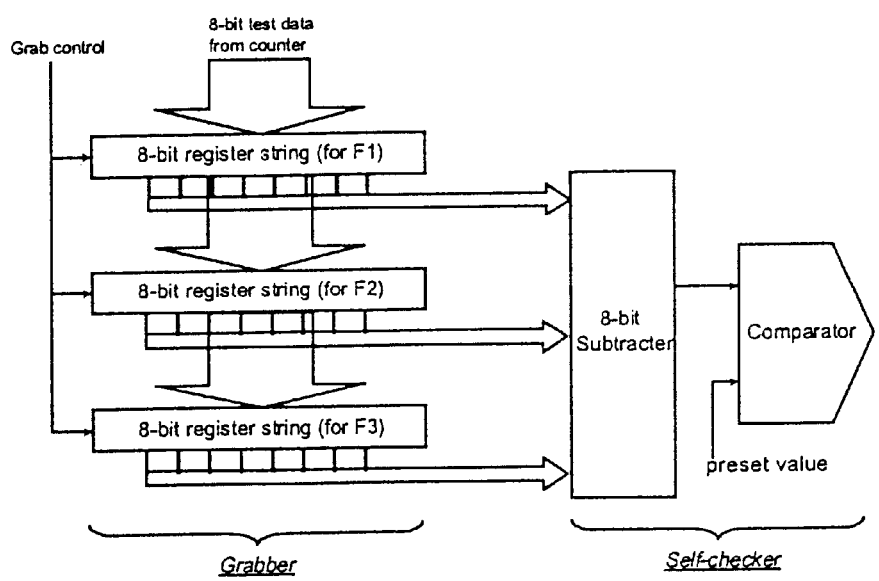
FIG. 9 illustrates the grabber portion of the controller/grabber block with a self-checker block.

In FIG. 7, a flow chart is drawn to help understand the overall test procedure described in the example. The control signals ET, TUP and TDN controls the charge-pump which are generated by a state-machine in the controller/grabber block. ET, which is the test enable signal, should remain high during the test period. It sets the mux at the end of the phase-detector block in the test mode. TUP controls the UP-current switch in the charge-pump when ET is high. It is active-low, since the p-type MOS transistor is used for UP-current switch. TDN is the control signal for the DOWN-current switch which is the n-type transistor.
STEP 4: Test Evaluation
7. Scan out: Using any existing scan path as in FIG. 8, the three stored digital values (F1,F2,F3) in the controller/grabber block are scanned out for test evaluations. Then, the |F1–F2| and |F3–F2| are evaluated for possible faults in the PLL blocks according to the flowchart in FIG. 7. The base values for C1, C2 and M1 are determined by logic or behavioral simulations, as is well known in the art and performed without undue experimentation. One example of a useful logic simulator is Verilog. One example of a useful behavioral simulator is Matlab. Other simulators may be used, as known in the art.
8. Self checking: An alternative way of evaluation, if a scan path is not available in the chip or the BIST has to incorporate the self-checking ability, is adding a subtracter and a comparator to form a self-checker in the controller/grabber block. This is shown in FIG. 9, where the subtracted values are compared with the preset values (base values) to make a go/no-go decision. The go/no-go decision is determined by a significant difference between the subtracted value and the preset value.

Figure 10:
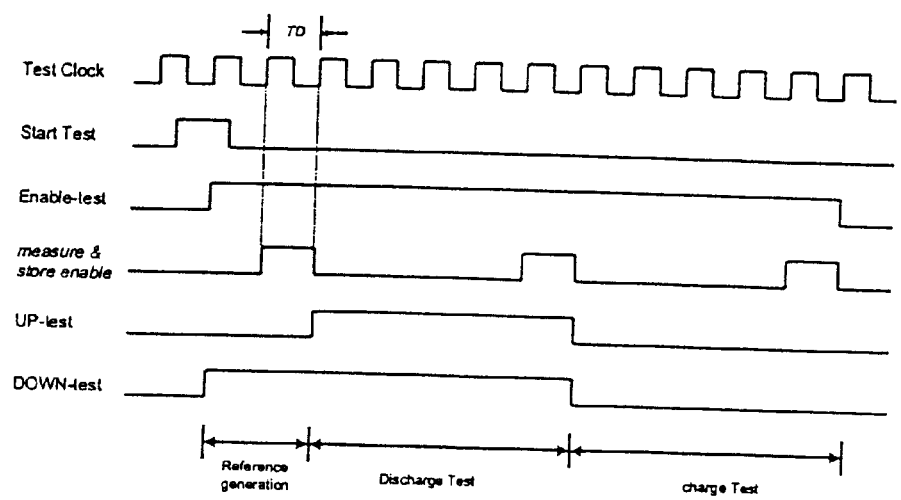
FIG. 10 is a timing diagram useful in the BIST technique.

FIG. 10 shows the overall timing of the controller/grabber block, the signals shown are related to the multiplexer and the controller/grabber block. The only input signals are Test-clock and Start-test signals. The Enable-test and measure-&-store-enable signal are internal signals generated by the controller. The output signals are UP-test and DOWN-test which controls the up-current switch and the down-current switch of the charge-pump, respectively.

Figure 11:
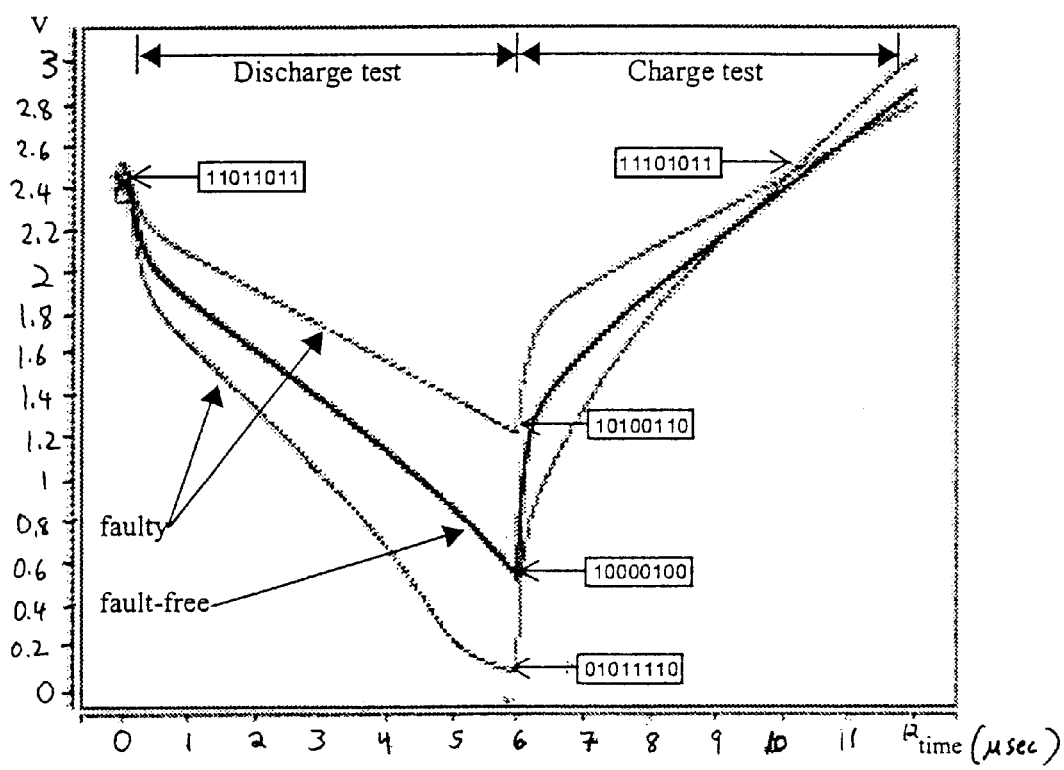
FIG. 11 is the output voltage of the loop filter using a PLL.

In FIG. 11, tests for faulty and fault-free cases are shown using the PLL provided by the National Semiconductor Corp. which has the operating range around 900 MHz with a single 3.3 volt power supply. It shows the output voltage of the loop-filter as well as the actual measured frequency data at each measurement points. These binary data are evaluated using the above test evaluation process (STEP 4). Table 1 shows the calculated differences between F1, F2 and F3 which are used to make a final decision. For the faulty cases, the difference between F1 and F2 were 53 and 125, where in the fault-free case showed 87. Also, the difference between F2 and F3 measured 69 and 141 for the faulty cases, 103 for the fault-free case. The values of |F1–F2| and |F3–F2| for faulty case show more than 33% deviations from the fault-free case value. Therefore, table 1 and the graph shown in FIG. 11 clearly demonstrates the fault detectability of the described BIST technique.

TABLE 1

Final digital outputs and differences due to fault

| Fault | Ref. Count (F1) | Down count (F2) | Up count (F3) | |F1–F2| | |F3–F2| |
|---|---|---|---|---|---|
| Fault-free | 11011011 | 10000100 | 11101011 | 87 | 103 |
| Faulty case 1 | 11011011 | 10100110 | 11101011 | 53 | 69 |
| Faulty case 2 | 11011011 | 01011110 | 11101011 | 125 | 141 |

Monte-Carlo Analysis

Figure 12:
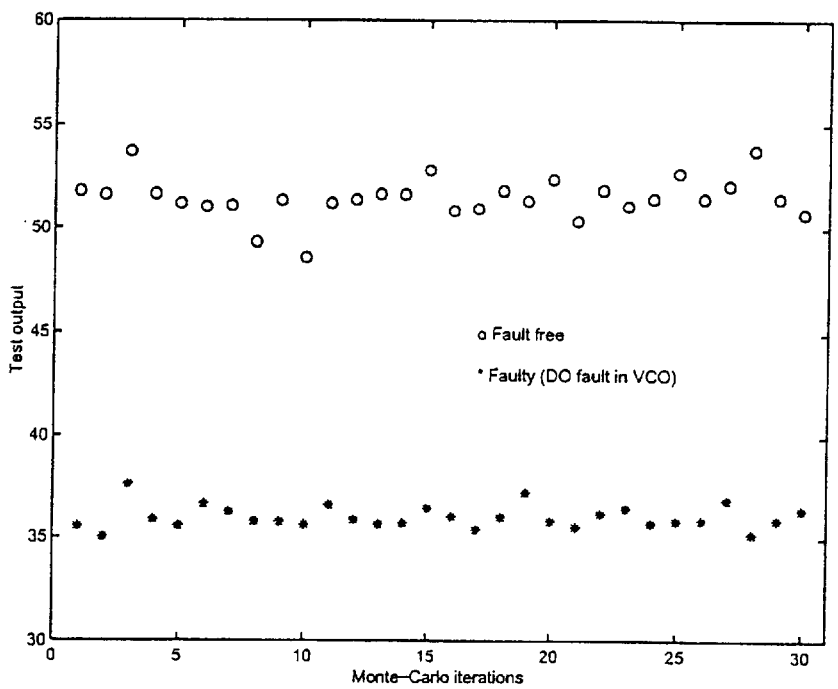
FIG. 12 is Monte-Carlo analysis for the charge test for one DO fault in the VCO.
Figure 13:
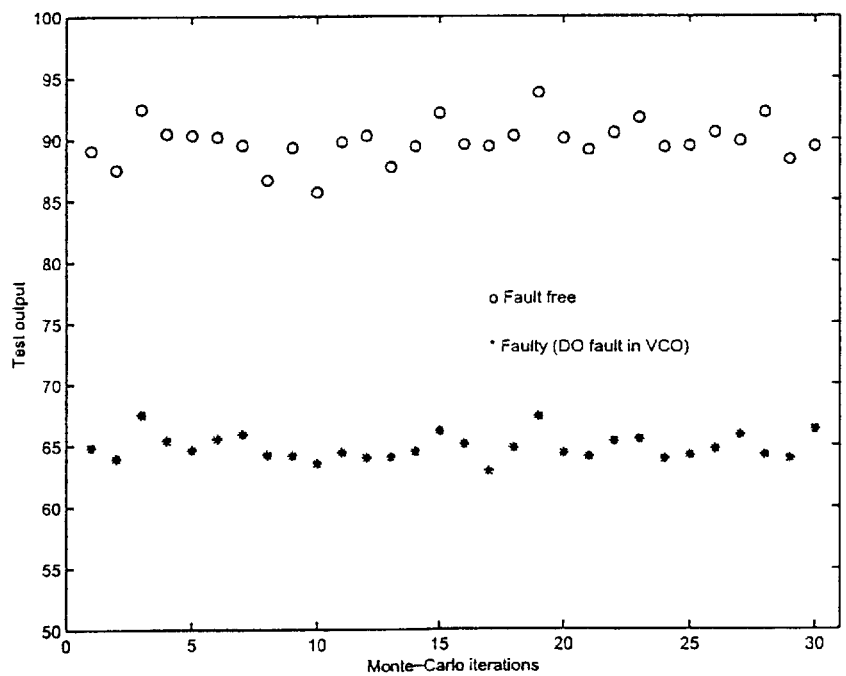
FIG. 13 is Monte-Carlo analysis for the discharge test for one DO fault in the VCO.

The effects of the process variations for the differences of the measured digital counts in two tests, which are charge test and discharge test have been analyzed. FIG. 12 shows Monte-Carlo results for the charge test, both fault-free and faulty cases are displayed for comparison. In this case, we chose drain-open fault in VCO, since its test results showed the least separation from the fault-free test results. Thus, it is the worst case for the Monte-Carlo analysis. As it can be observed in both FIGS. 12 and 13, the output of the faulty case varies well within the tolerance window, which means that the fault stays detectable even with the presence of process variations.

Structural Fault Simulation

A structural fault model of National's PLL (National Semiconductor Corporation, Santa Clara, Calif.) which includes complete set of catastrophic (hard) faults has been built to demonstrate the effectiveness of CF-BIST technique in detecting structural faults. The hard faults include:

Gate-to-source short (GSS)
Gate-to-drain short (GDS)
Drain-to-source short (DSS)
Resistor-short (RS)
Capacitance-short (CS)
Gate-open (GO)
Drain-open (DO)
Source-open (SO)
Resistor-open (RO)

A transistor short is modeled by a small resistance (1Ω) between the shorted terminals. A transistor open is modeled as a large resistance (10 MΩ) in series with the opened terminals. The small resistance value (1Ω) and the large resistance value (10 MΩ) are widely used values in structural fault simulations [11],[14],[15].

The gate-open is modeled by disconnecting the gate from other nodes and placing a large resistance (10 MΩ) between gate and the other two terminals. In the previous works [11],[14], the gate-open is modeled using only one large resistance which is placed between the gate and the source. This causes the faulty transistor to be always in the off-state which is not a realistic model for a gate-open fault.

The total number of structural faults (defects) was 395. These served as a practical fault model of the PLL for evaluating the CF-BIST described here. To demonstrate the efficiency of the CF-BIST technique, all 395 faults were used and simulations were carried out to evaluate the fault coverage for each configuration. Table 2 presents the fault coverage results.

As it can be observed in table 2, the CF-BIST structure described here clearly shows the effectiveness of the fault test. Therefore, it provides a low-cost and highly-effective BIST solution for detecting structural faults.

TABLE 2

Fault coverage results

| Fault Type | Fault coverage (%) |
|---|---|
| DO | 100 |
| GO | 82.4 |
| SO | 100 |
| GDS | 100 |
| GSS | 100 |
| DSS | 97.1 |
| RO | 100 |
| RS | 100 |
| CS | 100 |
| Overall | 96.5 |

Although the description above contains many specificities, these should not be construed as limiting the scope of the invention but as merely providing illustrations of some of the presently-preferred embodiments of this invention. For example, the technology described herein can be used to implement structural fault-based testing, performance testing, jitter measurements and parametric phase-locked loop measurements for computer and telecommunications systems, as well as other applications known in the art at any frequency. The disclosed invention can be used to test any clock circuit or oscillator circuit in systems such as computer systems or telecommunications systems. Any modifications necessary to use the technique in systems other than those described specifically herein are well known to one of ordinary skill in the art and are performed without undue experimentation using the teachings described herein.

All references cited herein are hereby incorporated by reference to the extent not inconsistent with the disclosure herewith.

References

[1] M. Abramovici, M. A. Breuer, A. D. Friedman, "Digital Systems Testing and Testable Design," *Computer Science Press*, pp.395–407, 1990.

[2] Y. Xing, "Defect-Oriented Testing of Mixed-Signal ICs: Some Industrial Experience," *IEEE Proceedings International Test Conference*, pp.678–687, 1998.

[3] M. Soma, "Challenges in Analog and Mixed-Signal Fault Models," *Circuit & Devices, pp.*16–19, January 1996.

[4] G. Devarayanadurg, P. Goteti, M. Soma, "Hierarchy Based Statistical Fault Simulation of Mixed-Signal ICs," *IEEE Proceedings International Test Conference*, pp.521–527, 1996.

[5] K. Arabi, B. Kaminska, "Oscillation Built-In Self Testability (OBIST) Scheme for Functional and Structural Testing of Analog and Mixed-Signal Integrated Circuits," *IEEE Proceedings International Test Conference*, pp.786–795, 1997.

[6] B. R. Veillette, G. W. Roberts, "On-Chip Measurement of the Jitter Transfer Function of Charge-Pump Phase-Locked Loops," *IEEE Proceedings International Test Conference*, pp.776–784, 1997.

[7] K. Arabi, B. Kaminska, "Design and Realization of an Accurate Built-In Current Sensor for On-Line Power Dissipation Measurement and IDDQ Testing," *IEEE Proceedings International Test Conference*, pp.578–586, 1997.

[8] M. F. Toner, G. W. Roberts, "ABISTScheme for an SNR Test of a Sigma-Delta ADC," *IEEE Proceedings International Test Conference*, pp.805–814, 1993.

[9] F. M. Gardner, "Charge-pump phase-lock loops," *IEEE Trans. Communications*, Vol. COM-28, pp.1849–1858, November 1980.

[10] P. Goteti, G. Devarayanadurg, M. Soma, "DFT for Embedded Charge-Pump PLL Systems Incorporating IEEE 1149.1," *IEEE Custom Integrated Circuits Conference*, pp.210–213, 1997.

[11] I. Rayane, J. Velasco-Medina and M. Nicolaidis, "A Digital BIST for Operational Amplifiers Embedded in Mixed-Signal Circuits," *IEEE VLSI Test Symposium, pp.*304–310, 1999.

[12] LogicVision, Inc., "pllBIST TM—THE CHIP-LEVEL SOLUTION Loops," Data sheet 1998.

[13] B. R. Veillette, G. W. Roberts, "Stimulus Generation for Built-In Self-Test of Charge-Pump Phase-Locked Loops," *IEEE Proceedings International Test Conference*, pp.698–707, 1998.

[14] F. Azais, M. Renovell, Y Bertrand, A. Ivanov, and S. Tabatabaei, "A Unified Digital Test Technique for PLLs: Catastrophic Faults Covered," *IEEE International Mixed Signal Testing Workshop*, pp.269–292, 1999.

[15] Jiun-Lang Huang, Chen-Yang Pan, and Kwang-Ting Cheng, "Specification back-Propagation and Its Application to DC Fault Simulation for Analog/mixed-Signal Circuits," *IEEE VLSI Test Symposium*, pp.220–225, 1999.

[16] M. Sachdev, "A realistic defect oriented testability methodology for analog circuits," *J. of Electronic Testing, Theory and Applications*, pp.265–276, 1995.

We claim:

1. A method of self-testing an integrated circuit for a fault comprising:

applying an input stimulus to a self-test component of said integrated circuit;

detecting an output value from said integrated circuit; and comparing the output value to a base value, wherein a significant difference indicates a fault is present, wherein said integrated circuit comprises a test controller;

a multiplexer connected to said test controller;

a charge pump connected to said multiplexer;

a loop filter connected to said charge pump;

a VCO connected to said loop filter;

a divide-by-N connected to said VCO and to said test controller;

a phase detector connected to said multiplexer and to said divide-by-N;

a circuit input connected to said phase detector; and a circuit output connected to said divide-by-N.

2. The method of claim 1, wherein said integrated circuit is a clock or an oscillator.

3. The method of claim 1, wherein said comparing step comprises producing a fail signal when there is a significant difference between said output value and said base value, and producing a pass signal when there is no significant difference between said output value and said base value.

4. The method of claim 1, wherein said integrated circuit is a phase-locked loop.

5. The method of claim 1, wherein said integrated circuit does not include a lock detector.

6. The method of claim 1, wherein said fault is parametric.

7. The method of claim 1, wherein said fault is structural.

8. The method of claim 1, wherein said integrated circuit consists essentially of:

a test controller;

a multiplexer connected to said test controller;

a charge pump connected to said multiplexer;

a loop filter connected to said charge pump;

a VCO connected to said loop filter;

a divide-by-N connected to said VCO and to said test controller;

a phase detector connected to said multiplexer and to said divide-by-N;

a circuit input connected to said phase detector; and a circuit output connected to said divide-by-N.

9. A method of claim 1 wherein said input stimulus comprises a signal applied to a controller, which controller communicates to a multiplexer, which multiplexer drives a charge pump, which charge pump drives a loop filter, which loop filter drives a voltage controlled oscillator to generate said output value.

10. An integrated circuit containing a built-in self test comprising:

a test controller;

a multiplexer connected to said test controller;

a charge pump connected to said multiplexer;

a loop filter connected to said charge pump;

a VCO connected to said loop filter;

a divide-by-N connected to said VCO and to said test controller;

a phase detector connected to said multiplexer and to said divide-by-N;

a circuit input connected to said phase detector; and a circuit output connected to said divide-by-N wherein an input stimulus is applied to said integrated circuit, an output value is detected from said integrated circuit, and the output value is compared to a base value, wherein a significant difference indicates a fault is present.

11. A phase locked loop having a built-in self test consisting essentially of:

a test controller;

a multiplexer connected to said test controller;

a charge pump connected to said multiplexer;

a loop filter connected to said charge pump;

a VCO connected to said loop filter;

a divide-by-N connected to said VCO and to said test controller;

a phase detector connected to said multiplexer and to said divide-by-N;

a circuit input connected to said phase detector; and a circuit output connected to said divide-by-N wherein an input stimulus is applied to said phase locked loop, an output value is detected from said phase locked loop, and the output value is compared to a base value, wherein a significant difference indicates a fault is present.

12. A method of testing a circuit comprising:

applying a start test signal to a test controller which generates a test stimulus;

applying said test stimulus to a multiplexer which generates a charge signal;

applying said charge signal to a charge pump which generates a filter signal;

applying said filter signal to a loop filter which generates an output voltage;

applying said output voltage to a VCO which generates an output frequency;

transmitting said output frequency to said test controller; and comparing said output frequency to a base value.

13. The method of claim 12, wherein said output frequency is converted to a digital value by a divide-by-N.

14. The method of claim 12, wherein said circuit is a phase-locked loop.

15. A method of testing a phase locked loop circuit which contains a built-in self test consisting essentially of the steps:

applying a start test signal to a test controller which is a component of said phase locked loop circuit which controller generates a test stimulus;

applying said test stimulus to a multiplexer which generates a charge signal;

applying said charge signal to a charge pump which generates a filter signal;

applying said filter signal to a loop filter which generates an output voltage;

applying said output voltage to a VCO which generates an output frequency;

transmitting said output frequency to said test controller; and comparing said output frequency to a base value.

16. The method of claim 15, wherein said output frequency is converted to a digital value by a divide-by-N.

17. A method of making the circuit of claim 10, comprising:

providing a substrate;

providing the components of the circuit in electrical connection with each other on said substrate.

* * * * *